United States Patent [19]

Rezvani

[11] Patent Number: 4,799,016
[45] Date of Patent: Jan. 17, 1989

[54] DUAL FREQUENCY NMR SURFACE COIL

[75] Inventor: Behrooz Rezvani, Shorewood, Wis.

[73] Assignee: General Electric Company, Milwaukee, Wis.

[21] Appl. No.: 80,038

[22] Filed: Jul. 31, 1987

[51] Int. Cl.[4] .......................................... G01R 33/20
[52] U.S. Cl. ..................................... 324/318; 324/322
[58] Field of Search ............... 324/309, 313, 314, 318, 324/322

[56] References Cited

U.S. PATENT DOCUMENTS 4,680,548 7/1987 Edelstein et al. .................... 324/318
4,686,473 8/1987 Chesneau et al. .................... 324/320
4,692,705 9/1987 Hayes ................................. 324/318
4,694,255 9/1987 Hayes ................................. 324/318

Primary Examiner—Stewart J. Levy
Assistant Examiner—Louis M. Arana
Attorney, Agent, or Firm—Quarles & Brady

[57] ABSTRACT

A surface coil for use in NMR imaging and NMR spectroscopy includes two cylindrical cage coils disposed around a common region of interest along a central axis. One coil is tuned to the Larmor frequency of $^{31}$phosphorous and the other coil is tuned to the Larmor frequency of hydrogen.

5 Claims, 5 Drawing Sheets

DUAL FREQUENCY NMR SURFACE COIL

BACKGROUND OF THE INVENTION

The field of the invention is nuclear magnetic resonance imaging methods and systems. More particularly, the invention relates to a local coil which may be used to provide localized application of an RF excitation pulse and the localized reception of the NMR signals produced in an NMR scanner system.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant q of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (RF excitation field $B_1$) which is in the x-y plane and which is near the Larmor frequency, the net aligned moment, $M_z$, may be rotated, or "tipped", into the x-y plane to produce a net transverse magnetic moment $M_1$, which is rotating, or spinning, in the x-y plane at the Larmor frequency. The degree to which the net magnetic moment $M_z$ is tipped and, hence, the magnitude of the net transverse magnetic moment $M_1$ depends primarily on the length of time and magnitude of the applied RF excitation field $B_1$.

The practical value of this phenomenon resides in the signal which is emitted by the excited spins after the RF excitation signal $B_1$ is terminated. In simple systems the excited spins induce an oscillating sine wave signal in the receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the RF excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulse NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude and duration. Such RF excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is subjected to a sequence of NMR measurement cycles which vary according to the particular localization method being used. The received NMR signals are digitized and processed to reconstruct the image using one of many well known reconstruction techniques. To perform such a scan, it is of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the NMR signals can be identified.

NMR has rapidly developed into an imaging modality which is utilized to obtain tomographic, projection and volumetric images of anatomical features of live human subjects. Such images depict the nuclear-spin distribution (typically protons associated with water and fat), modified by specific NMR properties of tissues, such as spin-lattice ($T_1$), and spin-spin ($T_2$) relaxation time constants. They are of medical diagnostic value because they depict anatomy and allow tissue characterization.

The NMR scanners which implement these NMR techniques are constructed in a variety of sizes. Small, specially designed machines, are employed to examine laboratory animals or to provide images of specific parts of the human body. On the other hand, "whole body" NMR scanners are sufficiently large to receive an entire human body and produce an image of any portion thereof.

There are a number of techniques employed to produce the RF excitation field ($B_1$) and receive the NMR signal. The simplest and most commonly used structure is a single coil and associated tuning capacitor which serves to both produce the excitation signal and receive the resulting NMR signal. This resonant circuit is electronically switched between the excitation circuitry and the receiver circuitry during each measurement cycle. Such structures are quite commonly employed in both small NMR scanners and whole body NMR scanners.

It is also quite common to employ separate excitation coils and receiver coils. While such NMR scanners require additional hardware, the complexities of electronic switching associated with the use of a single coil are eliminated and specially designed coils may be employed for the excitation and receiver functions. For example, in whole body NMR scanners it is desirable to produce a circularly polarized excitation field ($B_1$) by using coils which are orthogonally oriented, and which are driven with separate excitation signals that are phase shifted 90° with respect to each other. Such an excitation field is not possible with a single coil.

It is very difficult to construct a large coil which has both a uniform and high sensitivity to the NMR signal produced in a whole body NMR scanner. As a result, another commonly used technique is to employ "surface" coils to either generate the RF excitation signal ($B_1$), receive the resulting NMR signal, or both generate and receive. Such surface coils are relatively small and are constructed to produce the desired field or receive the NMR signal from a localized portion of the patient. For example, different surface coils may be employed for imaging the head and neck, legs and arms, or various internal organs. When used as a transmitter, the surface coil should produce a uniform, homogeneous RF excitation field throughout the region of interest, and when employed as a receiver, the surface coil should provide a relatively uniform sensitivity to the NMR signals produced by the spin throughout the region of interest.

A surface coil construction which satisfies these requirements is described in U.S. Pat. No. 4,694,255, issued on Sept. 15, 1987 and entitled "Radio Frequency Field Coil For NMR." This surface coil is characterized by a pair of spaced loop elements which are connected together by a series of conductive segments containing reactive components. The desired resonant frequency of this "cylindrical cage" surface coil is determined by the geometry of the loop elements and conductive segments, and the size of the reactive components. The bird cage surface coil is thus constructed to operate at a single RF frequency which corresponds to the Larmor frequency of the particular spin being studied or imaged.

Although the nuclei of hydrogen atoms in water and fat produce the strongest NMR signals, other nuclei such as $^{19}F$, $^{13}C$ and $^{31}P$ also produce useful signals at frequencies quite different than that of hydrogen. Analysis of the NMR signals produced by phosphorous nuclei can be particularly revealing since phosphorous is involved in many metabloic processes and can be used to monitor intra-cellular pH. Because the NMR signal from hydrogen nuclei is much stronger, it is the predominent spin resonance used to produce images or to localize the region in a patient from which NMR signals are being produced. Ideally, hydrogen pulse sequences are interleaved with spectroscopic pulse sequences for other nuclei such as $^{31}P$ and the hydrogen NMR signals are employed to locate the region from which the spectroscopic NMR signals are emanating. Such interleaved pulse sequences require the production of RF excitation pulses at two different frequencies and the reception of NMR signals at two different frequencies.

SUMMARY OF THE INVENTION

The present invention relates to a dual frequency surface coil for NMR spectroscopy applications. More particularly, the present invention includes a pair of cylindrical cage surface coils which surround a region of interest and which are constructed to resonate at two different frequencies. The two cylindrical cage surface coils are rotated about their central axes such that the fields which they produce and receive are substantially orthogonal.

A general object of the invention is to provide a surface coil for NMR spectroscopy which produces uniform, homogeneous, RF excitation fields in a region of interest at two Larmor frequencies and which receives the two separate NMR signals that result. The cylindrical cage surface coils are each formed on the same circular, cylindrical support member and they overlap each other to produce their RF excitation fields in the same region of interest. Each cylindrical cage surface coil is tuned to a separate Larmor frequency so that one excites and receives NMR signals from one nuclear species and the other excites and receives NMR signals from a second nuclear species.

Another object of the invention is to minimize the mutual coupling between the two cylindrical cage surface coils. This is accomplished in two ways. First, the two coils are rotated about their central axis such that the fields which they produce are substantially orthogonal to one another in the region of interest. Second, the cylindrical cage surface coil which is tuned to the lower Larmor frequency resonates in its highest possible mode, and the cylindrical cage surface coil which is tuned to the higher Larmor frequency resonates in its lowest possible mode. This insures that mutual coupling between the two coils does not occur at another resonant mode frequency.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

The preferred embodiment of the invention is comprised of two separate cylindrical cage surface coils of the type described in the above cited co-pending patent application Ser. No. 548,745. The construction and operation of such surface coils will now be described briefly, but for a more exhaustive description, reference is made to co-pending application No. 548,745 which is incorporated herein.

Figure 1:
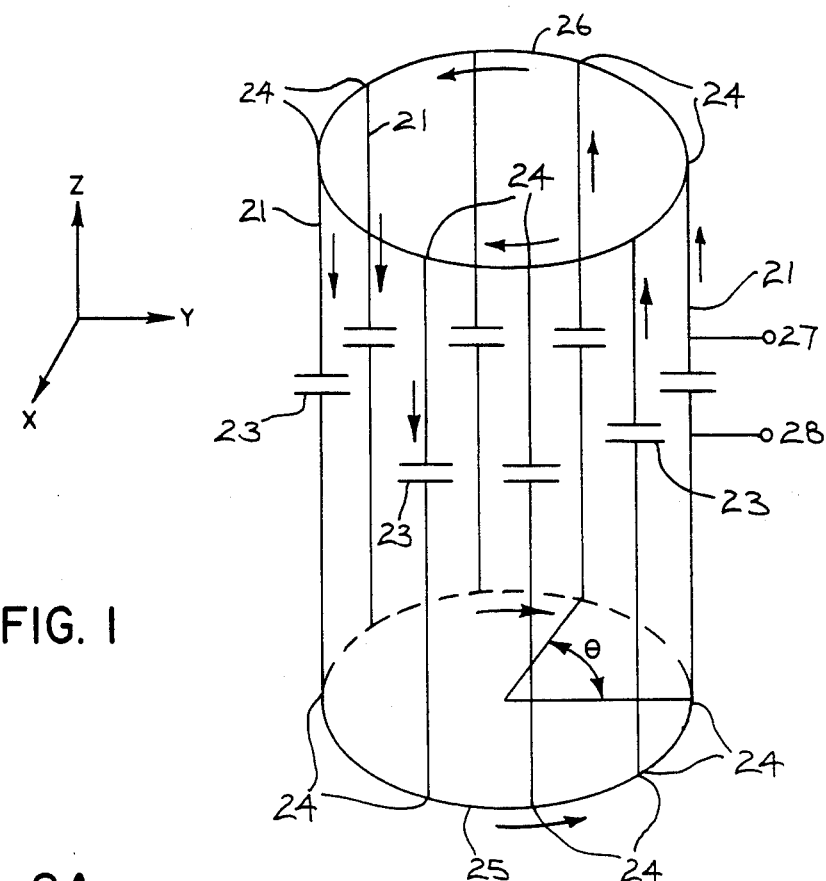
FIG. 1 is a schematic representation of a single cylindrical cage surface coil of the type employed in the present invention.

Referring particularly to FIG. 1, the cylindrical cage surface coil is comprised of a plurality of vertical conductive segments 21 which are evenly spaced and connected around upper and lower conductive circular loops 25 and 26. It will be recognized that the loops need not be precisely circular but may also be elipsoidal or of some other geometrical form generally having an opening which can accommodate the object to be examined. The volume within the cylindrical shaped coil is referred to herein as the "region of interest." Each of the vertical conductive segments 21 includes at least one reactive element 23. The multiple current paths in this structure are indicated by arrows.

To produce a homogeneous RF excitation field ($B_1$), a plurality of conductive segments 21 are required. These are distributed around the periphery of the conductive loops 25 and 26 such that the current in the conductive segments 21 approximate a sinusoidal distribution. Coils having 4, 8, 10, 16, and 32 conductive segments 21 have been constructed. It should be noted that the conductive segments 21 need not be evenly spaced. As the number of segments is increased, the resultant magnetic field is produced by contributions from many current paths so that the effect of any one conductor is reduced. The number of conductors cannot be increased without limit, however, since the open spaces between adjacent conductive elements 21 are needed to allow a path for the flow of magnetic flux. The resulting NMR surface coil may be thought of as a resonant cavity made up of an open-ended cylinder with an oscillating magnetic field transverse to the cylinder's central axis when the coil is excited by a sinusoidal voltage or current source. There are a number of resonant modes possible for this structure, as will be more fully described hereinafter.

Figure 2A:
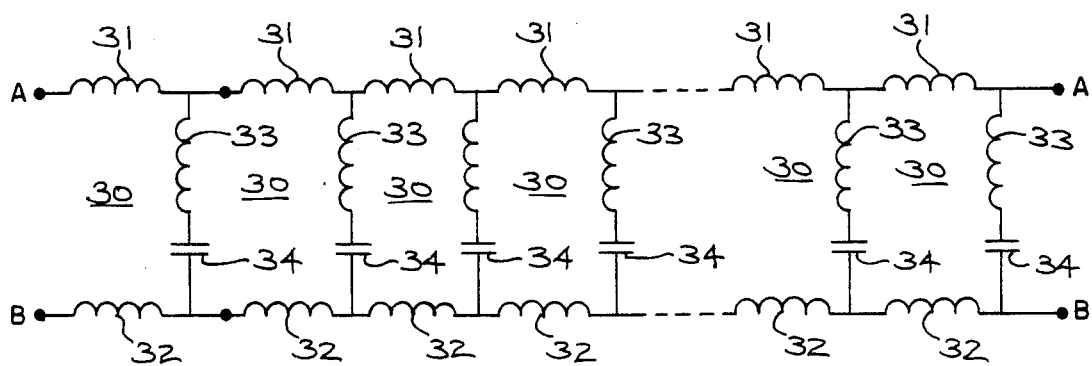
FIGS. 2A and 2B are electrical schematic diagrams of the coil of FIG. 1.
Figure 2B:
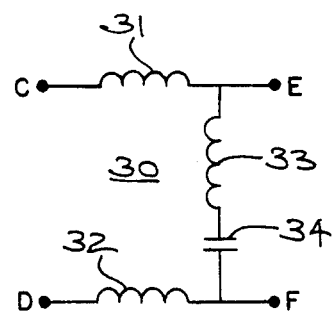

A lumped-element-equivalent circuit for the coil of FIG. 1 is shown in FIG. 2A. This equivalent circuit is a balanced-ladder network made up of a circuit unit 30 which is depicted in FIG. 2B. Each unit 30 is comprised of inductive end elements 31 and 32 connected together by a series circuit comprised of inductive and capacitive elements 33 and 34. The two points labelled "A" (FIG. 2A) are joined together to complete the upper conductive loop 26 of the coil, and the points labelled "B" are joined to complete the lower conductive loop 25. Inductors 31 and 32 represent the inductance associated with each loop segment 24 along the upper and lower conductive loops 26 and 25. These inductors are mutually inductively coupled. Likewise, inductors 33 associated with conductive segments 21 are all mutually inductively coupled.

Referring to FIG. 2B, the voltage between points E and F is phase shifted with respect to the voltage between points C and D. At the frequency where the cumulative phase shift for all units 30 adds to $2\pi$ radians, or any multiple thereof, the surface coil has a standing wave resonance. At this resonance, referred to as the primary resonance, the current in each conductive segment 21 has been found to be approximately proportional to sin R, where R (see FIG. 1) is the polar angle of the conductive segment 21 measured from the Y axis, for example. Such sinusoidal current distribution produces an increasingly more homogeneous transverse field as the number of conductive segments 21 is increased.

The coil configuration represented by the lumped-element-equivalent circuit of FIG. 2A can also exhibit higher frequency resonances which produce higher order transverse field distributions. The higher resonance frequencies are excited by using an appropriately higher frequency excitation source. These resonances will be referred to as secondary resonances. For example, when the cumulative phase shift around the network equals $4\pi$ radians, the currents in the conductive segments 21 are distributed in a sin 2 R pattern. For this resonance, the X and Y components of the RF excitation field show an approximately linear gradient along the X and Y axes, respectively, with nulls at the center of the surface coil.

Figure 3A:
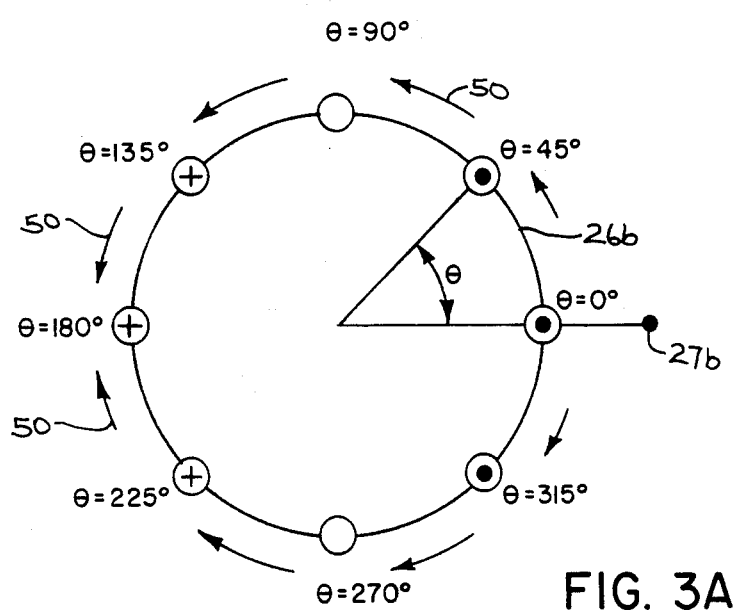
FIGS. 3A-3C are graphic representations of the operation of the coil of FIG. 1.
Figure 3B:
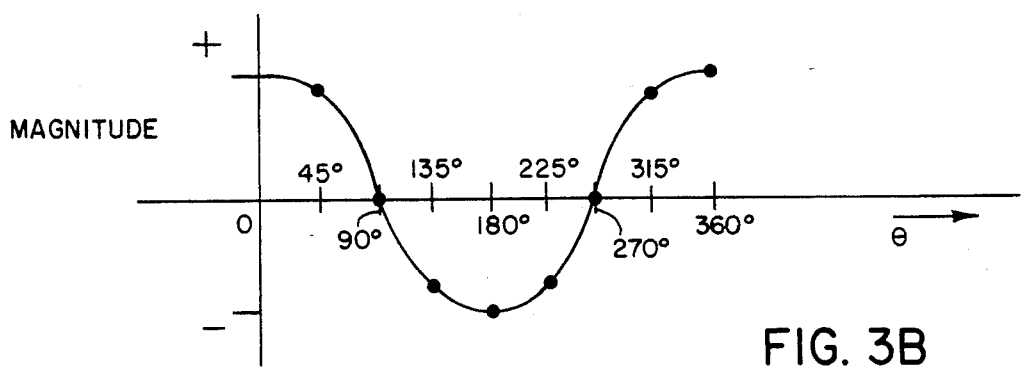

If the surface coil is driven by applying power from an RF amplifier (not shown) at a single point, such as between terminals 27 and 28 depicted in FIG. 1, the directions of currents are indicated by the arrows. The sinusoidal nature of these currents will now be discussed in greater detail. Referring to FIG. 3A, there is shown a top view of the coil depicted in FIG. 1. The coil is energized at points 27 and 28, which are in a segment arbitrarily assigned to a position R=0°. With the coil energized in this manner, the maximum current proportional to cos R flows in the segment located at R=0° in a direction out of the paper plane as suggested by the circled dot. Smaller currents (proportional to cos R wherein R=45° and 315°) flow in the same direction in the segments adjacent the one situated at R=0°. Currents of corresponding magnitude flow in an opposite direction (into the paper, as indicated by the circled cross) in the segments situated at R=180°, 135° and 225°. The magnitude of current flow in the conductive segments is graphically depicted in FIG. 3B, in which position angle R is indicated along the horizontal axis, while current magnitude is indicated along the vertical axis. Currents flowing out of the paper (45°, 0°, 315°) have been arbitrarily designated as having positive values, while those flowing into the paper (135°, 180°, 225°) have negative values. In the primary resonant mode, the segments at R=90° and R=270° do not conduct any current and in practice may be eliminated or replaced by short circuits.

Figure 3C:
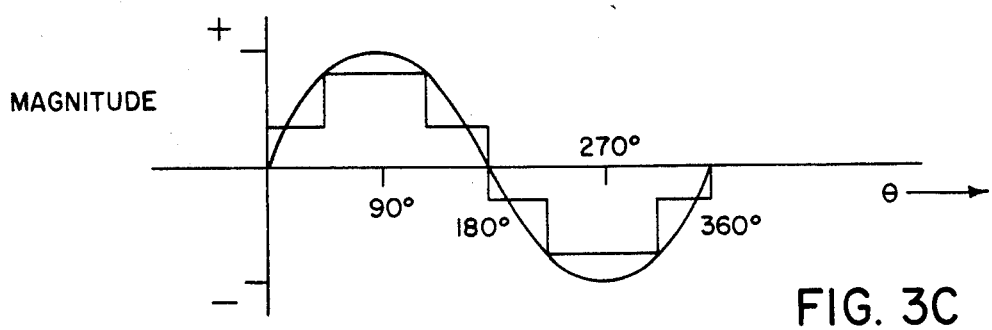

The direction of current flow in upper conductive loop 26 (FIG. 3A) is indicated by arrows 50 which are sized relative to one another to indicate approximate magnitudes. More precisely, loop current distribution is graphically depicted in FIG. 3C with angular position and current magnitude being indicated along horizontal and vertical axes, respectively, and wherein clockwise current flow is arbitrarily assigned to have a positive value. The loop currents are distributed in a stepwise manner. Thus, currents flowing between 45° and 90°, and between 315° and 270° are larger than those between 0° and 45°, and between 0° and 315°, respectively, since the former include currents provided by segments at 45° and 315°.

There are a number of ways that the NMR surface coil can be implemented for in vivo NMR studies. In the preferred embodiment, the conductive elements (e.g., 21, 25 and 26, FIG. 1) are constructed with wide sheets of conductive foil in order to minimize their self inductance. The distance between the upper and lower conductive loops 25 and 26 should be one or more times the coil diameter to reduce field inhomogeneity due to the currents in loops 25 and 26.

If a coil is required to resonate at a single predetermined frequency, it is possible to construct a coil patterned after FIG. 1 using only fixed capacitors. It is, however, more practical to include some variable elements for fine tuning the resonant frequency. The minimum requirement for tuning is to place a variable trimming capacitor in each of two conductive elements 21. Small perturbations on the capacitance at these two points will not greatly disturb the field homogeneity. Where a wider adjustment of resonant frequency is desired, it is preferable to tune all of the capacitors simultaneously or to change the effective inductance of the coil assembly. Small variations in inductance can be achieved by varying the width of foil-conductive elements. Larger variations in inductance can be achieved by varying the distance between the two conductive loops 25 and 26.

Figure 4:
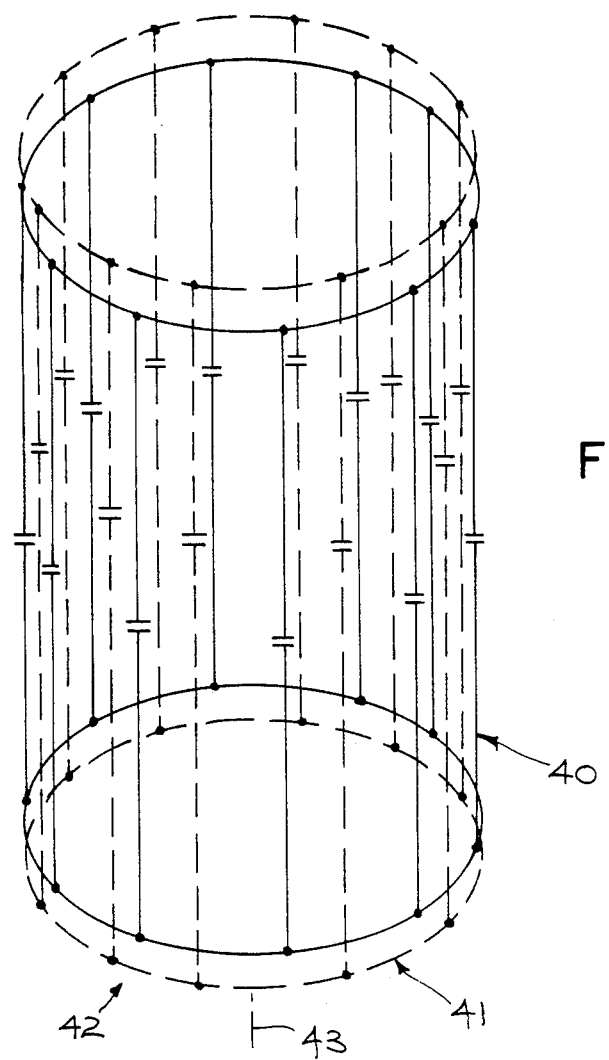
FIG. 4 is a schematic representation of the preferred embodiment of the surface coil of the present inventions.
Figure 5:
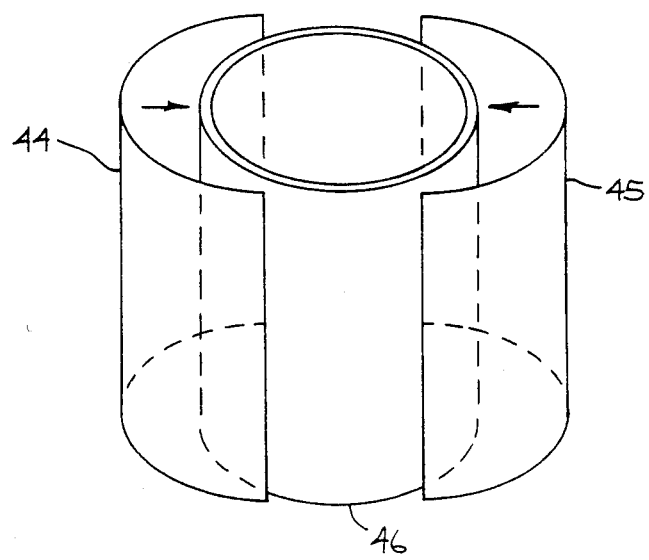
FIG. 5 is a pictoral view of the preferred embodiment of the invention showing its construction from two separate flexible printed circuit boards mounted to a support member.

The present invention employs two cylindrical cage surface coils of the type shown in FIG. 1. Two such surface coils 40 and 41 are shown schematically in FIG. 4 with one shown in solid lines and the other in dashed lines. The coils 40 and 41 are electrically insulated from each other although they occupy the same space and surround the same circular, cylindrical region of interest 42 and the same central axis 43. As shown in FIG. 5, the coils 40 and 41 are fabricated by etching two single-sided copperclad teflon resin flexible printed circuit boards 44 and 45. The two etched circuit boards 44 and 45 are then bonded to a tubular support member 46 which is made of acrylic and which has a diameter of 7 inches. Each of the two circuit boards 44 and 45 thus encircles one half of the support member 46 and provides 180° of the coil's electrical structure.

Figure 6:
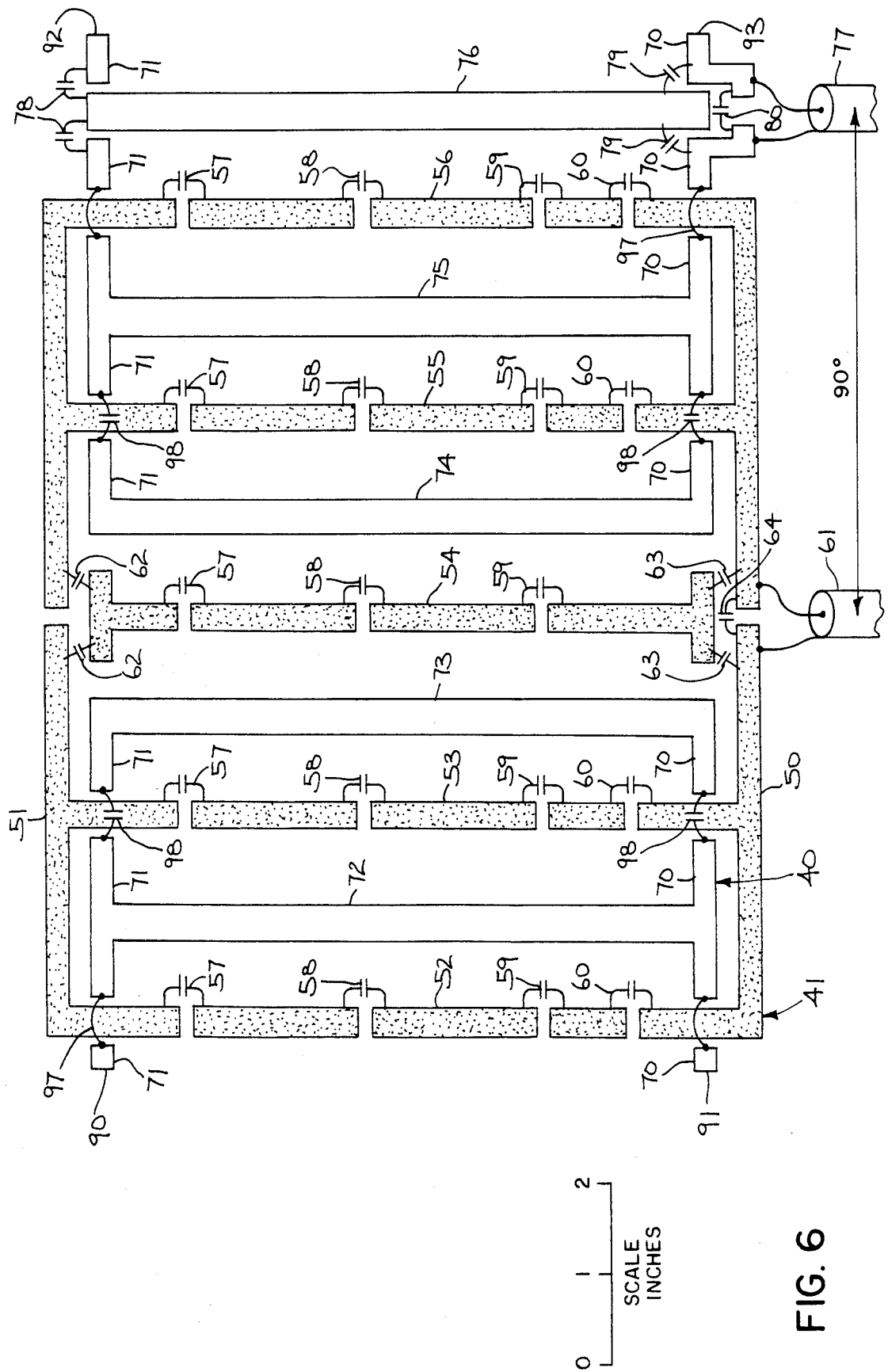
FIG. 6 is a plan view of one of the flexible printed circuit boards which is employed in the preferred embodiment of the invention.

Referring particularly to FIG. 6, the conductive pattern which forms the coils 40 and 41 on the circuit boards 44 and 45 is shown. The cylindrical cage surface coil 41 is tuned to resonate at 63.86 MHZ, the Larmor frequency of hydrogen nuclei in the NMR scanner in which the surface coil is used. The coil 41 includes a pair of spaced end segments 50 and 51 which wrap around the cylindrical support member 46 and five parallel conductive segments 52–56 which connect between the end segments 50 and 51 and which run the length of the support member 46. Each conductive segment 52–56 includes four, series connected capacitors 57–60 having nominal values of 51 pf, 160 pf, 150 pf, and 250 pf, respectively. The conductive segment 54 is slightly different than the others, since it is used to couple the signal to and from the surface coil 41 through a coaxial cable 61. This conductive segment 54 is not connected directly to the end segments 50 and 51, but is, instead, connected through 120 pf capacitors 62 to the end segment 51 and through 180 pf capacitors 63 to the other end segment 50. A 30 pf capacitor 64 bridges a break in the end segment 50 and the signal is applied and detected thereacross.

The cylindrical cage surface coil 40 is tuned to resonate at 25.86 MHZ, the Larmor frequency of $^{31}$phosphorous. The coil 40 includes a pair of spaced end segments 70 and 71 which wrap around the cylindrical support member 46. The end segments 70 and 71 are connected together by five parallel conductive segments 72–76 which extend along the length of the cylindrical support element 46. The upper end of the conductive segment 76 couples to the end segment 71 through a pair of 200 pf capacitors 78 and couples to the lower end segment 70 through a pair of 400 pf capacitors 79. A 30 pf capacitor 80 connects across a gap in the lower end segment 70 and the signal for the cable 77 is produced thereacross.

The end segments 70 and 71 of the coil 40 cross over the conductive segments 52, 53, 55 and 56 of the coil 41. The two coils 40 and 41 are electrically insulated from each other and at four of these cross over points a conductive foil jumper 97 spans the conductive segments 52 and 56 and is insulated therefrom by a low dielectric, high voltage breakdown material such as that manufactured and sold by 3M Corporation under the trademark "Kapton." The remaining four cross over points are bridged by 400 pf capacitors 98 which are also insulated from the conductive segments 53 and 55.

The coil patterns shown in FIG. 6 are combined with identical coil patterns on the other printed circuit board to form the two cage surface coils 40 and 41 about the cylindrical support member 46. The coaxial cable connections are not duplicated on the other printed circuit board, but, otherwise, it is the same. No connections are required between the two sections of the coil structure 41, however, the coil structures 40 on each printed circuit board 44 and 45 are soldered together at the points 90–93 to complete the electrical interconnection. While the two coils 40 and 41 are different in size and appearance, in principle they operate the same but over different frequencies.

It is important to note that the two coils 40 and 41 are formed such that they are rotated 90 degrees with respect to each other. This is most clearly indicated by the 90 degree spacing between the points on each at which the coaxial cables 61 and 71 connect. This insures that at the resonant frequency of each coil 40 and 41, their magnetic fields within the region of interest 42 are orthogonal to each other. This further reduces the cross coupling between the two coils 40 and 41.

As indicated above, the cylindrical cage surface coil has a number of modes in which it can resonate. Thus, even though the surface coils 40 and 41 in the preferred embodiment are designed to resonate at 25.86 MHZ and 63.86 MHZ, respectively, in fact, they also resonate at other frequencies as well. It is a further teaching of the present invention that the cylindrical cage surface coils should be designed such that there is no coupling between them due to any of the resonant frequencies of one coil being substantially the same as one of the resonant frequencies of the other coil.

Figure 7A:
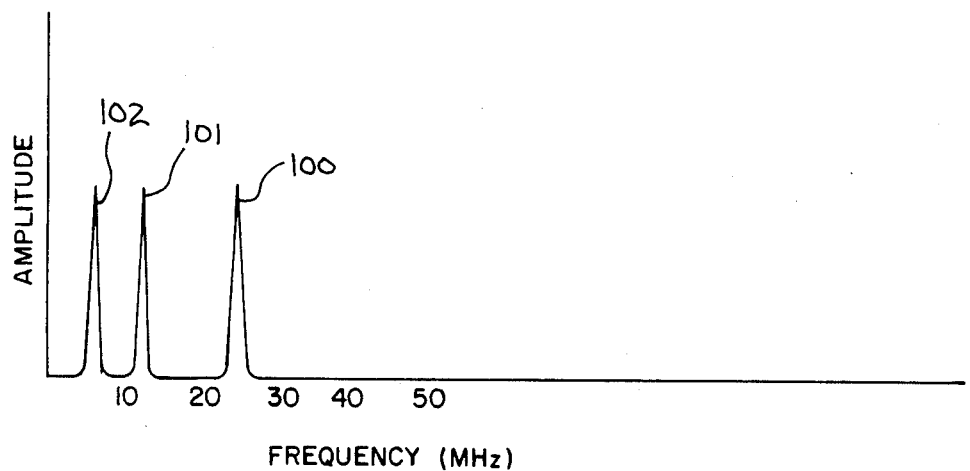
FIGS. 7A and 7B are graphic representations of the resonant frequencies of each cylindrical cage surface coil employed in the preferred embodiment of the invention.

The response of the cylindrical cage surface coil 40 as a function of frequency is shown in FIG. 7A. The desired resonant peak 100 occurs at 25.86 MHZ and two other resonant frequencies are indicated by peaks 101 and 102. No resonant conditions exist at frequencies above the desired resonant peak 100, and the surface coil 40 is referred to herein as a high-pass cylindrical cage surface coil because its highest resonant frequency is tuned to the desired resonant frequency.

Figure 7B:
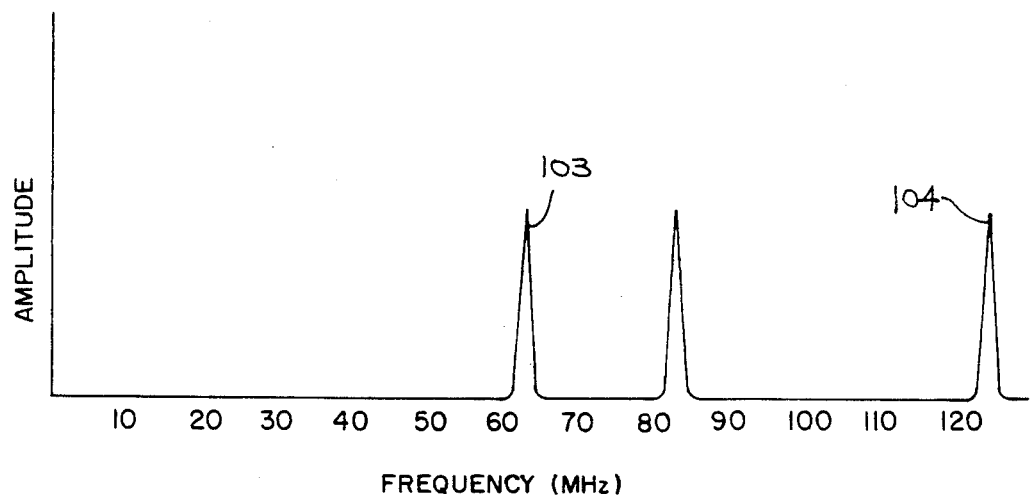

On the other hand, the response of the cylindrical cage surface coil 41 as a function of frequency is shown in FIG. 7B. The desired resonant peak 103 at 63.87 MHZ is the lowest frequency at which resonance can occur. Other peaks, such as the peak 104, occur at higher frequencies, and the cylindrical cage surface coil 41 is referred to herein as a low-pass cylindrical cage surface coil. It should be apparent, therefore, that by using a low-pass surface coil to resonate at the lower of two Larmor frequencies and a high-pass surface coil to resonate at the higher Larmor frequency, other resonances of the two cylindrical cage surface coils cannot coincide and cause coupling between the two coils.

I claim:

1. A dual frequency NMR radio-frequency (RF) coil comprising:

a first cylindrical cage coil having a first pair of conductive loop elements disposed in a spaced-apart relation along a central axis, and a plurality of first conductive segments electrically interconnecting the first conductive loop elements at points spaced along the periphery of each of said first conductive loop elements, and the first conductive segments include reactive elements which have values that cause the first cylindrical cage coil to resonate at a lower RF frequency; and a second cylindrical cage coil which is electrically insulated from said first cylindrical cage coil, and having a second pair of conductive loop elements disposed in a spaced-apart relation along the central axis, and a plurality of second conductive elements electrically interconnecting the second conductive loop elements at points spaced along the periphery of each of said second conductive loop elements, and the second conductive segments include reactive elements which have values that cause the second cylindrical cage coil to resonate at a higher RF frequency.

2. The dual frequency NMR radio-frequency coil as recited in claim 1 in which the first and second cylindrical cage coils surround a common region of interest along the central axis.

3. The dual frequency NMR radio-frequency coil as recited in claim 2 in which the first and second cylindrical cage coils are oriented with respect to each other about the central axis such that the magnetic fields which they produce in the common region of interest are orthogonal with respect to each other.

4. The dual frequency NMR radio-frequency coil as recited in claim 2 or 3 in which the first cylindrical cage coil is a high-pass cylindrical cage coil and the second cylindrical cage coil is a low-pass cylindrical cage coil.

5. The dual frequency NMR radio-frequency coil as recited in claim 1 in which the lower RF frequency is the Larmor frequency of phosphorous and the higher RF frequency is the Larmor frequency of hydrogen.

* * * * *